US009805748B1

(12) United States Patent
Gong et al.

(10) Patent No.: US 9,805,748 B1
(45) Date of Patent: Oct. 31, 2017

(54) SYSTEM AND METHOD FOR PROVIDING A PROTECTIVE LAYER HAVING A GRADED INTERMEDIATE LAYER

(71) Applicant: Western Digital (Fremont), LLC, Fremont, CA (US)

(72) Inventors: Yongping Gong, Pakkret (TH); Budi Suswadi, Bangkok (TH); Phuwanai Bunnak, Pathumthani (TH); Kah Choong Loo, Pakkret (TH); Krisda Siangchaew, Ta Sai (TH)

(73) Assignee: WESTERN DIGITAL (FREMONT), LLC, Fremont, CA (US)

( * ) Notice: Subject to any disclaimer, the term of this patent is extended or adjusted under 35 U.S.C. 154(b) by 485 days.

(21) Appl. No.: 14/313,550

(22) Filed: Jun. 24, 2014

(51) Int. Cl.
G11B 5/40 (2006.01)
C23C 14/35 (2006.01)
H01J 37/34 (2006.01)
G11B 5/255 (2006.01)

(52) U.S. Cl.
CPC ............... G11B 5/40 (2013.01); C23C 14/35 (2013.01); G11B 5/255 (2013.01); H01J 37/3411 (2013.01)

(58) Field of Classification Search
None
See application file for complete search history.

(56) References Cited

U.S. PATENT DOCUMENTS

| 6,046,758 | A |   | 4/2000  | Brown et al. |
|-----------|---|---|---------|--------------|
| 6,066,399 | A | * | 5/2000  | Hirano ................ C23C 16/029 427/249.1 |
| 6,075,673 | A |   | 6/2000  | Wilde et al. |
| 6,097,575 | A |   | 8/2000  | Trang et al. |
| 6,125,014 | A |   | 9/2000  | Riedlin, Jr. |
| 6,125,015 | A |   | 9/2000  | Carlson et al. |
| 6,130,863 | A |   | 10/2000 | Wang et al. |
| 6,137,656 | A |   | 10/2000 | Levi et al. |
| 6,144,528 | A |   | 11/2000 | Anaya-Dufresne et al. |
| 6,147,838 | A |   | 11/2000 | Chang et al. |
| 6,151,196 | A |   | 11/2000 | Carlson et al. |
| 6,178,064 | B1 |   | 1/2001 | Chang et al. |
| 6,181,522 | B1 |   | 1/2001 | Carlson |
| 6,181,673 | B1 |   | 1/2001 | Wilde et al. |
| 6,229,672 | B1 |   | 5/2001 | Lee et al. |
| 6,236,543 | B1 |   | 5/2001 | Han et al. |
| 6,246,547 | B1 |   | 6/2001 | Bozorgi et al. |
| 6,249,404 | B1 |   | 6/2001 | Doundakov et al. |
| 6,274,206 | B1 | * | 8/2001 | Turchan ............. C23C 14/0605 427/248.1 |
| 6,284,377 | B1 | * | 9/2001 | Veerasamy ........... B05D 5/083 428/336 |
| 6,330,131 | B1 |   | 12/2001 | Nepela et al. |
| 6,339,518 | B1 |   | 1/2002 | Chang et al. |
| 6,349,017 | B1 |   | 2/2002 | Schott |
| 6,373,660 | B1 |   | 4/2002 | Lam et al. |

(Continued)

Primary Examiner — Kevin Bernatz
(74) Attorney, Agent, or Firm — Gabriel Fitch; Loza & Loza, LLP

(57) ABSTRACT

A method of providing an apparatus with a protective layer by simultaneously depositing carbon and seed material on the apparatus to form an intermediate layer, wherein the carbon and seed material have a percentage composition that varies as a function of the intermediate layer thickness; and then providing a diamond-like carbon (DLC) layer adjacent to the intermediate layer to produce the protective layer.

13 Claims, 8 Drawing Sheets

(56) References Cited

U.S. PATENT DOCUMENTS

| | | |
|---|---|---|
| 6,378,195 B1 | 4/2002 | Carlson |
| 6,433,965 B1 | 8/2002 | Gopinathan et al. |
| 6,522,504 B1 | 2/2003 | Casey |
| 6,538,850 B1 | 3/2003 | Hadian et al. |
| 6,569,295 B2 | 5/2003 | Hwang et al. |
| 6,583,953 B1 | 6/2003 | Han et al. |
| 6,646,832 B2 | 11/2003 | Anaya-Dufresne et al. |
| 6,661,612 B1 | 12/2003 | Peng |
| 6,665,146 B2 | 12/2003 | Hawwa et al. |
| 6,690,545 B1 | 2/2004 | Chang et al. |
| 6,704,173 B1 | 3/2004 | Lam et al. |
| 6,708,389 B1 | 3/2004 | Carlson et al. |
| 6,717,773 B2 | 4/2004 | Hawwa et al. |
| 6,721,142 B1 | 4/2004 | Meyer et al. |
| 6,744,599 B1 | 6/2004 | Peng et al. |
| 6,771,468 B1 | 8/2004 | Levi et al. |
| 6,796,018 B1 | 9/2004 | Thornton |
| 6,801,402 B1 | 10/2004 | Subrahmanyam et al. |
| 6,856,489 B2 | 2/2005 | Hawwa et al. |
| 6,873,496 B1 | 3/2005 | Sun et al. |
| 6,912,103 B1 | 6/2005 | Peng et al. |
| 6,937,439 B1 | 8/2005 | Chang et al. |
| 6,956,718 B1 | 10/2005 | Kulkarni et al. |
| 6,972,930 B1 | 12/2005 | Tang et al. |
| 7,006,330 B1 | 2/2006 | Subrahmanyam et al. |
| 7,006,331 B1 | 2/2006 | Subrahmanyam et al. |
| 7,010,847 B1 | 3/2006 | Hadian et al. |
| 7,019,945 B1 | 3/2006 | Peng et al. |
| 7,027,264 B1 | 4/2006 | Subrahmanyam et al. |
| 7,085,104 B1 | 8/2006 | Hadian et al. |
| 7,099,117 B1 | 8/2006 | Subrahmanyam et al. |
| 7,154,696 B2 | 12/2006 | Nikitin et al. |
| 7,174,622 B2 | 2/2007 | Meyer et al. |
| 7,289,299 B1 | 10/2007 | Sun et al. |
| 7,307,816 B1 | 12/2007 | Thornton et al. |
| 7,315,435 B1 | 1/2008 | Pan |
| 7,315,436 B1 | 1/2008 | Sanchez |
| 7,414,814 B1 | 8/2008 | Pan |
| 7,436,631 B1 | 10/2008 | Fanslau, Jr. et al. |
| 7,474,508 B1 | 1/2009 | Li et al. |
| 7,477,486 B1 | 1/2009 | Sun et al. |
| 7,495,865 B2 | 2/2009 | Chen et al. |
| 7,593,190 B1 | 9/2009 | Thornton et al. |
| 7,595,963 B1 | 9/2009 | Chen et al. |
| 7,616,405 B2 | 11/2009 | Hu et al. |
| 7,618,720 B2 * | 11/2009 | Derflinger ............ C23C 14/0641 428/216 |
| 7,729,089 B1 | 6/2010 | Hogan |
| 7,808,750 B2 | 10/2010 | Yanagisawa et al. |
| 7,995,310 B1 | 8/2011 | Pan |
| 8,081,400 B1 | 12/2011 | Hu |
| 8,087,973 B1 | 1/2012 | Sladek et al. |
| 8,089,730 B1 | 1/2012 | Pan et al. |
| 8,164,858 B1 | 4/2012 | Moravec et al. |
| 8,199,437 B1 | 6/2012 | Sun et al. |
| 8,208,224 B1 | 6/2012 | Teo et al. |
| 8,218,268 B1 | 7/2012 | Pan |
| 8,240,545 B1 | 8/2012 | Wang et al. |
| 8,256,272 B1 | 9/2012 | Roajanasiri et al. |
| 8,277,962 B2 | 10/2012 | Zhou et al. |
| 8,284,527 B2 | 10/2012 | Yoshida et al. |
| 8,295,012 B1 | 10/2012 | Tian et al. |
| 8,295,013 B1 | 10/2012 | Pan et al. |
| 8,295,014 B1 | 10/2012 | Teo et al. |
| 8,320,084 B1 | 11/2012 | Shum et al. |
| 8,325,446 B1 | 12/2012 | Liu et al. |
| 8,325,447 B1 | 12/2012 | Pan |
| 8,339,742 B1 | 12/2012 | Sladek et al. |
| 8,339,747 B1 | 12/2012 | Hales et al. |
| 8,339,748 B2 | 12/2012 | Shum et al. |
| 8,343,363 B1 | 1/2013 | Pakpum et al. |
| 8,345,519 B1 | 1/2013 | Pan |
| 8,418,353 B1 | 4/2013 | Moravec et al. |
| 8,441,896 B2 | 5/2013 | Wang et al. |
| 8,446,694 B1 | 5/2013 | Tian et al. |
| 8,456,643 B2 | 6/2013 | Prabhakaran et al. |
| 8,456,776 B1 | 6/2013 | Pan |
| 8,462,462 B1 | 6/2013 | Moravec et al. |
| 8,477,459 B1 | 7/2013 | Pan |
| 8,485,579 B2 | 7/2013 | Roajanasiri et al. |
| 8,488,279 B1 | 7/2013 | Pan et al. |
| 8,488,281 B1 | 7/2013 | Pan |
| 8,490,211 B1 | 7/2013 | Leary |
| 8,514,522 B1 | 8/2013 | Pan et al. |
| 8,533,936 B1 | 9/2013 | Puttichaem et al. |
| 8,545,164 B2 | 10/2013 | Choumwong et al. |
| 8,553,365 B1 | 10/2013 | Shapiro et al. |
| 8,587,901 B1 | 11/2013 | Puttichaem et al. |
| 8,593,764 B1 | 11/2013 | Tian et al. |
| 8,599,653 B1 | 12/2013 | Mallary et al. |
| 8,605,389 B1 | 12/2013 | Pan et al. |
| 8,611,050 B1 | 12/2013 | Moravec et al. |
| 8,611,052 B1 | 12/2013 | Pan et al. |
| 8,623,197 B1 | 1/2014 | Kobsiriphat et al. |
| 8,624,184 B1 | 1/2014 | Souza et al. |
| 8,638,529 B1 | 1/2014 | Leng et al. |
| 8,665,566 B1 | 3/2014 | Pan et al. |
| 8,665,567 B2 | 3/2014 | Shum et al. |
| 8,665,677 B1 | 3/2014 | Panitchakan et al. |
| 8,665,690 B1 | 3/2014 | Moravec et al. |
| 8,693,144 B1 | 4/2014 | Pan et al. |
| 8,756,795 B1 | 6/2014 | Moravec et al. |
| 8,758,083 B1 | 6/2014 | Rudy et al. |
| 8,760,812 B1 | 6/2014 | Chen et al. |
| 8,770,463 B1 | 7/2014 | Puttichaem et al. |
| 8,773,664 B1 | 7/2014 | Wang et al. |
| 8,792,212 B1 | 7/2014 | Pan et al. |
| 8,792,213 B1 | 7/2014 | Vijay et al. |
| 8,797,691 B1 | 8/2014 | Tian et al. |
| 2006/0029806 A1* | 2/2006 | Hyodo ................. G11B 5/8408 428/408 |
| 2007/0236837 A1* | 10/2007 | Chen ....................... G11B 5/40 360/235.2 |
| 2008/0113224 A1* | 5/2008 | Ono ....................... C23C 16/26 428/827 |
| 2008/0187781 A1 | 8/2008 | Cheng et al. |
| 2009/0029068 A1* | 1/2009 | Kanazawa ........... C23C 14/025 427/577 |
| 2011/0052934 A1* | 3/2011 | Sugimoto ........... C23C 14/0605 428/623 |
| 2013/0244541 A1 | 9/2013 | Yaemglin et al. |
| 2013/0293982 A1 | 11/2013 | Huber |
| 2014/0065445 A1* | 3/2014 | Katano ................. G11B 5/725 428/833.3 |

* cited by examiner

SYSTEM AND METHOD FOR PROVIDING A PROTECTIVE LAYER HAVING A GRADED INTERMEDIATE LAYER

RELATED APPLICATIONS

This application is related to "SYSTEMS AND METHODS FOR TUNING SEED LAYER HARDNESS IN COMPONENTS OF MAGNETIC RECORDING SYSTEMS," Ser. No. 13/797,069 filed on Mar. 12, 2013 for Yongping Gong.

BACKGROUND

FIG. 1 shows a simplified plan view of a magnetic storage device 20, which includes a magnetic storage medium 24. FIG. 1 also shows a data read/write device 28 that includes an actuator arm 25 (actuator), and a slider 12. The slider 12 is attached to the actuator 25 by a suspension (not shown) and is positioned very close to the disk surface. Slider 12 has an air bearing surface (ABS) facing medium 24. While the spindle 40 rotates, actuator 25 sweeps over medium 24 resulting in aerodynamic pressure being created between the slider 12 and medium 24. The aerodynamic pressure causes slider 12 to float over the surface of the medium 24.

FIG. 2 illustrates a simplified isometric view of a magnetoresistive head 36 embedded in a slider 12. The current trend in the magnetic storage technology has been to push the slider design toward a near zero flying height in order to reduce the head media spacing (HMS), thereby increasing the data recording capacity. Because of the surface contact with the magnetic storage disk made by the trailing edge of the ABS, the surfaces of the magnetic storage disk and the ABS of the conventional slider experience continual erosion or wear, thereby resulting in material loss from both the magnetic storage disk and the ABS. This material loss forms debris in the vicinity of the read/write sensor on the slider. As the debris accumulates, the ability of the proximity recording head to register binary data onto the magnetic storage disk suffers a significant degradation due to an increase in HMS. If the wear is not properly controlled, the burnishing can eventually expose the read/write sensor to the ambient environment. Because of its susceptibility to atmospheric corrosion, the read/write sensor may fail to achieve its functionality and adversely impact proximity recording performance when exposed to the drive environment. There is thus a need for an improved system and method for protecting components from corrosion and wear.

DETAILED DESCRIPTION

Referring now to FIGS. 3-11, embodiments for providing a protective layer for an apparatus will now be described. A layer intermediate between a substrate to be protected and an upper carbon layer is referred to as the intermediate layer. Together the intermediate layer and carbon layer are referred to as the protective layer. The protective layer may have several different functions, but generally serves to protect components from wear and corrosion. In certain embodiments, the intermediate layer functions to enhance adhesion, improve hardness, density and electrical resistivity. The intermediate layer may also act as a diffusion barrier to prevent undesired shunting from occurring between the carbon layer and the underlying substrate or component. The components to be protected by the protective layer may include a slider, tool, instrument or other apparatus that is susceptible to wear, erosion and/or corrosion over a prolonged period.

Figure 1:
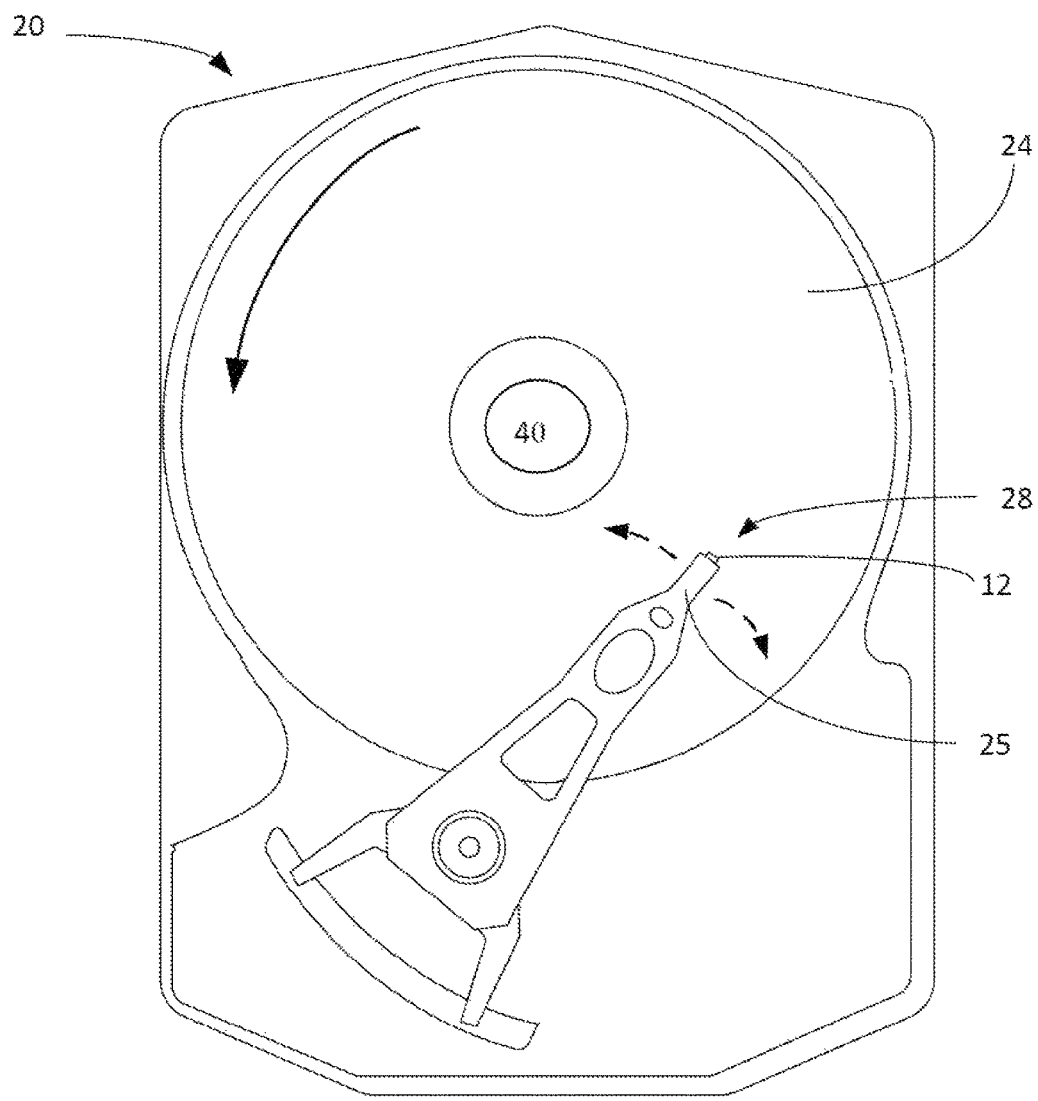
FIG. 1 is a simplified top view of a disk drive.
Figure 2:
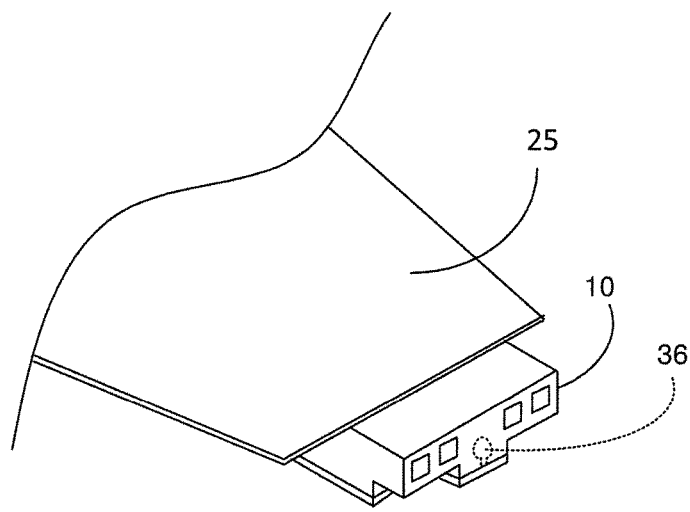
FIG. 2 is an isometric view of a slider in a disk drive.
Figure 3:
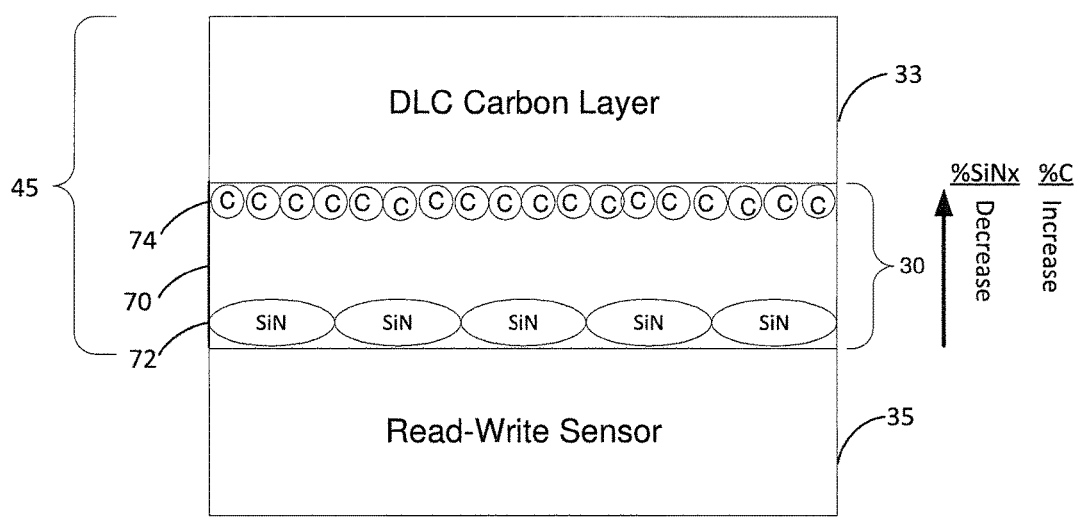
FIG. 3 is a schematic view of a graded intermediate layer for the slider of FIG. 2.

A protective layer 45 on a substrate 35 is shown in FIG. 3. In FIG. 3, protective layer 45 is a bilayer formed of both intermediate layer 30 and carbon layer 33. Intermediate layer 30 has a first interface 72, generally adjacent to substrate 35 and a second interface 74 (interface 74) adjacent to DLC layer 33. The intermediate layer 30 is composed of a carbon mixture that includes a seed material. The percentage of carbon and the percentage of seed material within the carbon mixture vary continuously with respect to the thickness of intermediate layer 30. In some embodiments, the seed material can be a silicon-containing compound or silicon nitride as shown in FIG. 3. In other embodiments, the seed material may be titanium, titanium nitride, titanium carbide, or a titanium-containing compound. In FIG. 3, intermediate layer 30 is silicon-rich at the first interface 72 and carbon-rich at the interface 74. Thus, the composition of intermediate layer 30 at first interface 72 (between the substrate and intermediate layer 30) may be between 95 and 100% seed material, while the composition at interface 74 may be between 95 and 100% carbon.

Between the first interface 72 and interface 74 of intermediate layer 30 resides a middle portion 70 that contains a variable percentage of carbon mixture. The actual percentage of seed material and carbon depends on the substrate that is being protected and the desired properties for the final apparatus. For example, depending on the apparatus, enhanced mechanical and electrical properties may be attained by adjusting the percentage of seed material and the percentage of carbon during formation of intermediate layer 30. The variable percentage of carbon and seed material contributes to forming a graded composite in intermediate layer 30. In some embodiments, middle portion 70 has a composition of about 15-40% silicon, 10-30% nitrogen and 20-70% carbon. Yet in other embodiments, middle portion 30 may have a composition of about 10-40% titanium, 0-40% nitrogen and 20-60% carbon.

Although silicon nitride is shown as the seed material in FIG. 3, various other materials may be used instead. In several embodiments, the seed material(s) can be Ti, TiN, Si, $Si_3N_4$, SiNx, $Ti_xSi_3N_4$, where x is a non-zero positive integer, and/or other suitable seed materials. In a number of embodiments, the hardness of the intermediate layer resulting from the deposition of the seed material(s) and the carbon is proportional to the amount of the carbon deposited, and more specifically, the amount of sp3 bonds deposited or injected.

Figure 4:
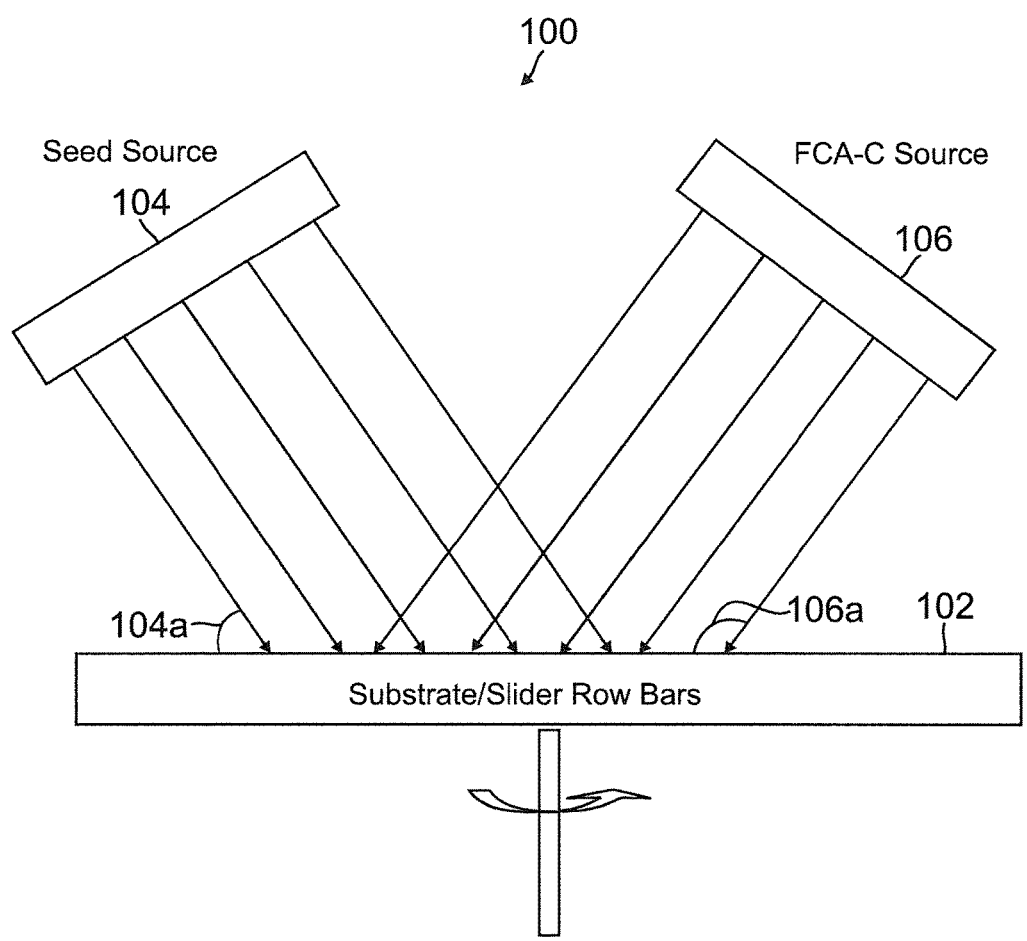
FIG. 4 is a top view of a two source vacuum deposition system for forming a protective layer on a substrate in accordance with one embodiment.

Referring now to FIG. 4, the manner in which the protective layer is formed on a substrate will be described. FIG. 4 is a top view of a two source vacuum deposition system (vacuum system) 100 for providing a protective layer on a substrate. A suitable seed material source (seed source) may be a cathode magnetron such as a radio frequency (RF) magnetron. The seed source 104 is configured to deposit one or more seed materials on the substrate(s) being held by pallet 102 at a first angle 104a measured with respect to a top surface of the substrate(s) on pallet 102. In several embodiments, the top surface of pallet 102 corresponds to a top surface of the row bars mounted within the pallet 102. However, in other embodiments, the substrate may have a top surface that exceeds an upper surface of the pallet. Hereinafter, all references to the pallet are intended to mean a holder that carries a substrate (or apparatus) to be coated with the novel protective layer described herein. The two source vacuum system 100 also includes a carbon source (FCA-C) 106 configured to deposit or inject sp3 carbon bonds on the pallet 102 at a second angle 106a measured with respect to a top surface of the pallet 102. In FIG. 4, sliders are shown arranged in row bars on a rotatable pallet 102 in accordance with one embodiment, although other types of components may be coated, such as a portion of a tool, a portion of an instrument, or magnetic media. Further, an apparatus such as a tool may also be covered with the protective layer described herein.

In operation, pallet 102 is configured to be rotated by a drive motor (not shown) along an axis 55 in direction 59 to achieve optimal deposition uniformity. The seed source 104 and the carbon source 106 are configured to be applied simultaneously or substantially simultaneously for most of the time during which the intermediate layer is formed. During the co-deposition process, the RF power (provided by the RF Magnetron) and the arc current (provided by the FCA carbon source) vary continuously from an initial level to a final level. The initial level and final level for both sources can be set at any values within their respective source operating limits.

The intermediate layer may be considered to be a graded composite because the relative composition percentages of carbon and seed material are continuously varied as a function of the intermediate layer thickness. The variation in percent and composition depends on the initial and final levels of the parameters selected to control the carbon deposition and seed material deposition during formation of the layer. At the same time, the deposition rates of the materials deposited by the seed source 104 and the FCA-C source 106 can be adjusted independently. As a result, in several embodiments, optimum hardness, density, and electrical resistivity properties can be imparted to the intermediate layer to prevent the DLC carbon layer diffusing into the underlying substrate. In other embodiments, adjusting various parameters of the vacuum system can impart both an improved wear resistance and an improved adhesion between the metal substrate and the protective layer. In such embodiments, the parameters for varying carbon deposition may include arc current, coil current or process chamber pressure, while for varying seed material deposition may include RF power, target to substrate distance, gas flow rate or process chamber pressure.

In several embodiments, the seed material can be Ti, TiN, Si, $Si_3N_4$, SiNx, $Ti_xSi_3N_4$, where X is a non-zero positive integer, and/or other suitable seed materials. In a number of embodiments, the hardness of the intermediate layer resulting from the deposition of the seed material and the carbon material is proportional to an amount of the carbon material deposited, and more specifically, the amount of sp3 bonds deposited or injected. In one embodiment, an atomic percent of the carbon material is greater than an atomic percent of the seed material to ensure a preselected degree of hardness for intermediate layer 30. In several embodiments, the co-deposition process is performed such that the intermediate layer has a preselected number of the sp3 carbon bonds.

In some embodiments, the first angle 104a for the seed material, measured with respect to the top surface of the substrate 102, ranges from about 30 degrees to about 70 degrees. In another embodiment, the first angle 104a ranges from about 40 degrees to about 50 degrees. In some embodiments, the second angle 106a for the carbon material, measured with respect to the top surface of the substrate, ranges from about 75 degrees to about 105 degrees. In another embodiment, the second angle 106a ranges from about 80 degrees to about 100 degrees. In the embodiment of FIG. 4, the seed source 104 and the carbon source (FCA-C) 106 are shown as having particular angles for the first angle 104a and the second angle 106a. In other embodiments, the first angle 104a and the second angle 106a can have other suitable values.

In a number of embodiments, the substrate is rotated at a preselected speed during the deposition of the seed material and the carbon material to achieve a preselected degree of deposition uniformity. In one such embodiment, the preselected speed is in a range of about 15 rpm to about 30 rpm.

In several embodiments, the seed source 104 is a RF magnetron, and the carbon source 106 is a filtered cathodic arc (FCA-C). In one embodiment, the graded composite of intermediate layer 30 is formed by selecting at least one parameter of the vacuum system for varying carbon deposition and at least one parameter for varying the seed material deposition.

The deposition rate of carbon may be controlled by parameters such as arc current, coil current, process chamber pressure, or a combination of parameters such as arc current and coil current. The deposition rate of the seed material may be controlled by parameters such as RF power, target to substrate distance, gas flow rate or process chamber pressure.

In one such embodiment, the arc current of the FCA-C source 106 is initially set to about 20 to 25 amperes, and the RF power level of the seed source 104 is initially set to about 350 to 300 watts. During deposition of seed material, the RF power is gradually ramped down from a high initial value of about 300 to 350 watts to a low value of about 100 to 150 watts. Concurrently, while the RF power is being ramped down the arc current for the carbon source ramps up to about 100 to 125 amperes. The values described above for arc current and power levels are exemplary only, as other suitable ranges for initial and final values are also possible. When the desired thickness for the intermediate layer is attained, the seed source is turned off and the carbon source stays on for the DLC layer to be deposited. The thickness of intermediate layer 30 can be monitored in situ with an ellipsometer. Alternatively, the thickness of intermediate layer 30 is measured via transmission electron microscopy.

The thickness of the intermediate layer 30 can also be controlled, in an alternative embodiment, by turning off the seed source after a predetermined time interval has passed. In other embodiments, the seed source 104 can be an ion beam sputter source and/or a chemical vapor deposition (CVD) source. In some embodiments, another vacuum system configured with a carbon source and a seed source with suitable alignment capabilities can be used. In such embodiments, the alternative vacuum system can also include a pre-clean etch capability.

In some embodiments, the system further includes a sputter target for the seed material, where a distance between the sputter target and the substrate is about 20 cm to about 40 cm. In one embodiment, the system includes a vacuum deposition chamber containing the substrate 102, where the vacuum deposition chamber has a preselected pressure in a range of about 0.25 mTorr to about 1.25 mTorr. In one embodiment, the seed source 104 and the carbon source (FCA-C) 106 are configured to deposit the seed material and the carbon material, respectively, simultaneously for a duration of about 5 seconds to about 30 seconds. In other embodiments, the co-deposition may occur for a duration of about 10 to 25 seconds.

Figure 5:
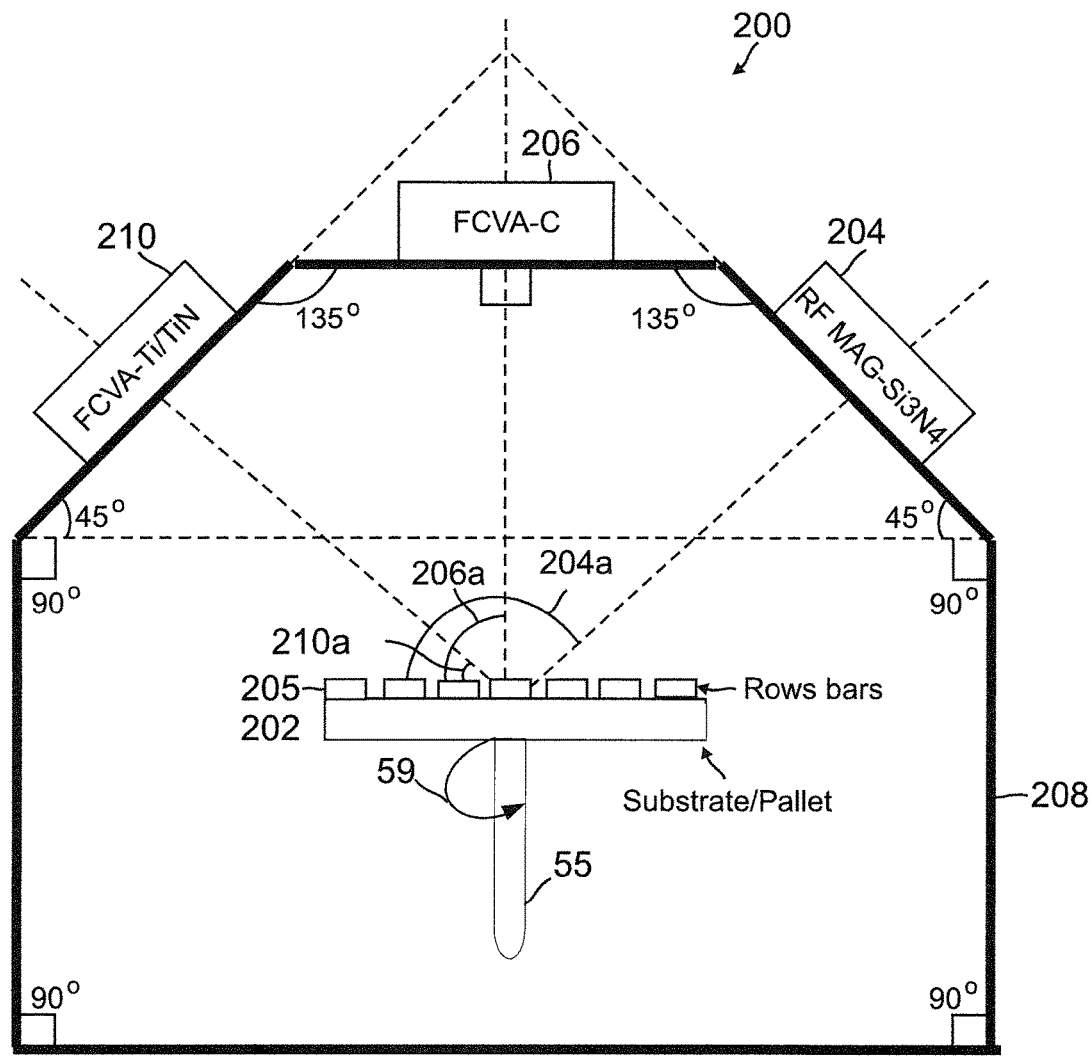
FIG. 5 is a top view of a three source vacuum deposition system for forming a protective layer on a substrate in accordance with one embodiment.

An alternative way of forming the protective layer 45 is by using the three source vacuum system 200 of FIG. 5, which includes a filtered cathodic vacuum arc carbon source (FCVA-C) 206. In some embodiments, the FCVA-C 206 is configured to provide sp3 carbon bonds on a top surface (e.g., air bearing surface) of a component, such as row bars 205, disposed on a pallet 202. The carbon is deposited or injected at a second angle 206a measured with respect to a top surface of the row bars 205. The three source vacuum system 200 also includes two seed sources. A first seed source 204 (e.g., RF magnetron) is configured to deposit a first seed material of $Si_3N_4$ on a top surface of the row bars 205 at a first angle 204a and a second seed source (e.g., filtered cathodic vacuum arc or FCVA-Ti/TiN) 210 is configured to deposit a second seed material of Ti/TiN on the row bars 205 at a third angle 210a. The deposition angles (204a, 206a, 210a) are each measured with respect to a top surface of row bars 205.

In FIG. 5, the first angle 204a for the first seed material is about 135 degrees. The second angle 206a for the carbon is about 90 degrees. The third angle 210a for the second seed material is about 45 degrees. In other embodiments, the first, second and third angles can have other suitable values. For example, in some embodiments, the first angle 204a ranges from about 125 degrees to about 145 degrees. In some embodiments, the second angle 206a ranges from about 75 degrees to about 105 degrees. In other embodiments, the third angle 210a ranges from about 35 degrees to about 55 degrees.

The three source vacuum system 200 includes a vacuum chamber 208 that encloses or substantially encloses the substrate 202 and row bars 205 disposed thereon. The carbon source (FCVA-C) 206, the first seed source 204, and the second seed source (FCVA-Ti/TiN) 210 are each mounted to an exterior surface of the vacuum chamber 208. In FIG. 5, a number of specific angles are shown for sides/walls of the vacuum chamber 208. In other embodiments, however, other suitable angles can be used for the three source vacuum deposition 200. In such embodiments, the substrate is rotated at a preselected speed during the deposition of the seed material(s) and the carbon to achieve a preselected degree of deposition uniformity. In one such embodiment, the preselected speed is in a range of about 15 rpm to about 30 rpm.

In FIG. 5, a pallet with the substrate to be treated is loaded into a load lock chamber (not shown) under a high vacuum pressure. Then, the load lock chamber is pumped down to a low pressure. The isolation value opens and a robotic arm (not shown) from vacuum chamber 208 extends out to transfer pallet 102 from load lock chamber onto an axis 55 in chamber 208. In operation, pallet 202 is configured to be rotated by a drive motor (not shown) coupled to axis 55 in a direction 59 to achieve optimal deposition uniformity. The carbon source 206 and one or both of the first seed source 204 and the second seed source 210 are configured to be applied substantially simultaneously and for about the same duration. The deposition rates of the materials deposited by the seed sources (204,210) and the carbon source 206 can be adjusted independently. As a result, the hardness, density and electrical resistivity properties of the protective layer 45 can be achieved by selecting specific deposition rates for carbon and the seed material(s), as well as by selecting specific deposition parameters and a suitable thickness for intermediate layer 30.

In some embodiments, the substrate 202 can be replaced with a magnetic medium for a magnetic recording system rather than the sliders arranged in row bars. In several embodiments, the seed material(s) can be Ti, TiN, Si, $Si_3N_4$, SiNx, $Ti_xSi_3N_4$, where X is a non-zero positive integer, and/or other suitable seed materials. In a number of embodiments, the hardness of the intermediate layer resulting from the deposition of the seed material(s) and the carbon is proportional to the amount of the carbon deposited, and more specifically, the amount of sp3 bonds deposited or injected.

The three source system described herein may include a sputter target for the seed material(s), where a distance between the sputter target and the substrate is about 20 cm to about 40 cm. In one embodiment, the vacuum deposition chamber 208 has a preselected pressure in a range of about 0.25 mTorr to about 1.25 mTorr. In this embodiment, the seed source(s) (204, 210) and the carbon source (FCVA-C) 206 are configured to deposit the seed material(s) and the carbon material, respectively, simultaneously for a duration of about 5 seconds to about 30 seconds.

Figure 6:
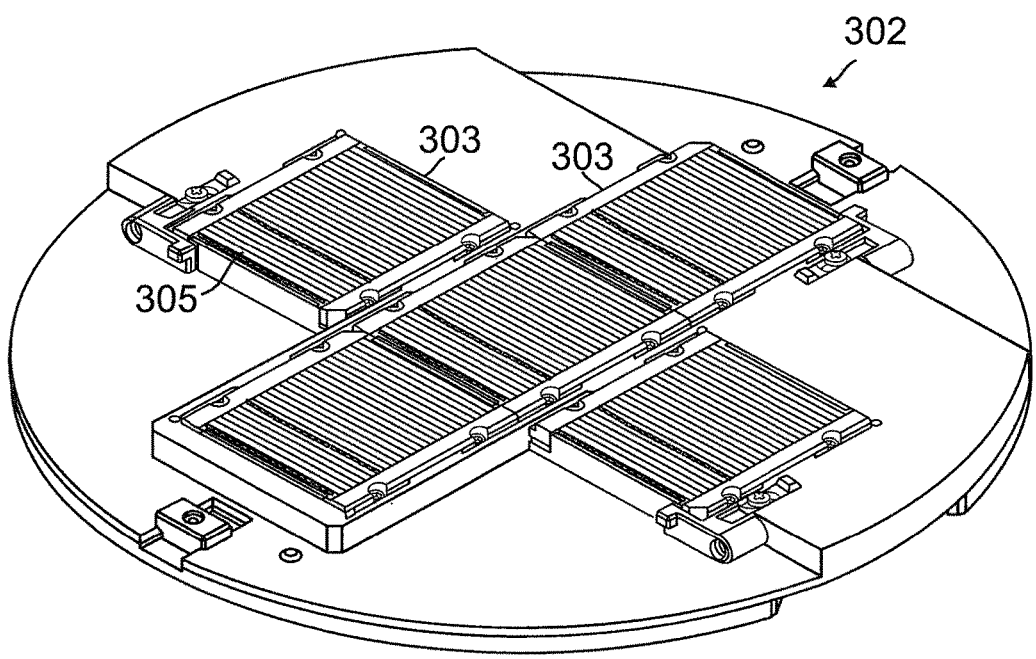
FIG. 6 is a perspective view of a rotatable pallet with multiple row bar carriers that can be used in the vacuum deposition systems of FIG. 4 or FIG. 5.

FIG. 6 is a perspective view of a rotatable pallet 302 with multiple row bar carriers 303 that can be used in the vacuum systems of FIG. 4 or FIG. 5. More specifically, five row bar carriers 303 are mounted to the pallet 302. Each carrier 303 has a rectangular shape with a length of about 2 to 3 inches and a width of about 2 inches, though other suitable dimensions will work as well. Each carrier 303 includes a number of slots configured to receive the row bars 305. Each carrier 303 is configured to retain about 40 to 50 row bars 305, though other suitable numbers of row bars can be retained as well. In the embodiment illustrated in FIG. 6, the pallet 302 is configured to support and retain five carriers 303. In other embodiments, the pallet 302 can be configured to support and retain more than, or fewer than, five carriers 303.

Figure 7:
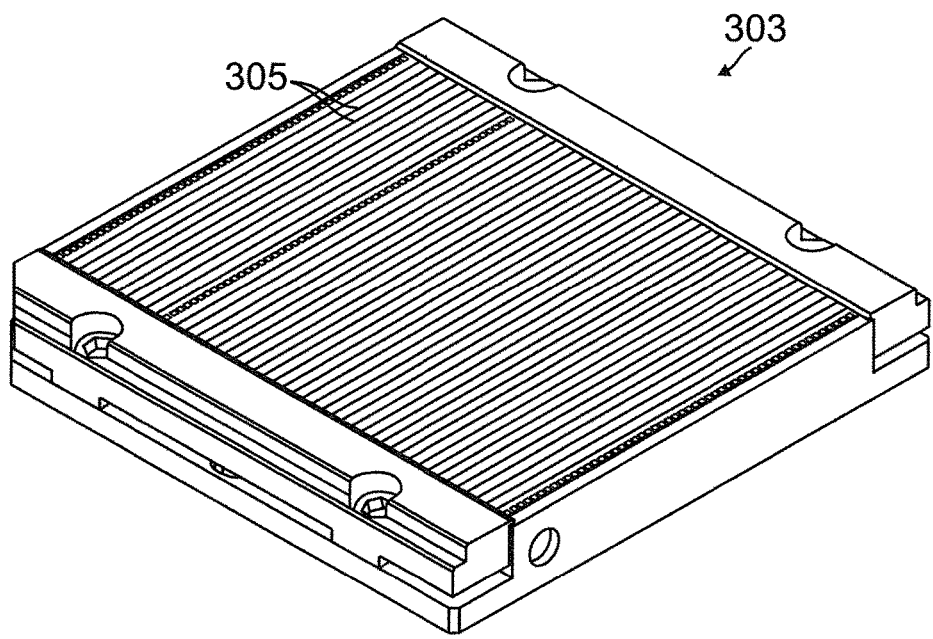
FIG. 7 is an expanded perspective view of a row bar carrier of the rotatable pallet of FIG. 6.

FIG. 7 is an expanded perspective view of the row bar carrier 303 of the rotatable pallet 302 of FIG. 6. As can be seen in FIG. 7, the carrier 303 contains a number of row bars 305. Each row bar 305 has an exposed surface that corresponds to the air bearing surface (ABS) of the sliders embedded in row bars 305. In several embodiments, about 50 to 60 sliders are disposed in a given row bar. The protective layer 45 is provided on row bars 305 in accordance with any of the methods described herein. The intermediate layer 30 can be deposited using one or both of the vacuum systems described above in association with FIG. 4 and FIG. 5.

The protective layers 45 formed in accordance with the embodiments described above have a total thickness of between about fifteen and twenty five angstroms. The intermediate layer 30, which constitutes a portion of protective layer 45, may have a thickness of three to nine angstroms. In other embodiments, intermediate layer 30 may have a thickness ranging from about three to about six angstroms.

Figure 8:
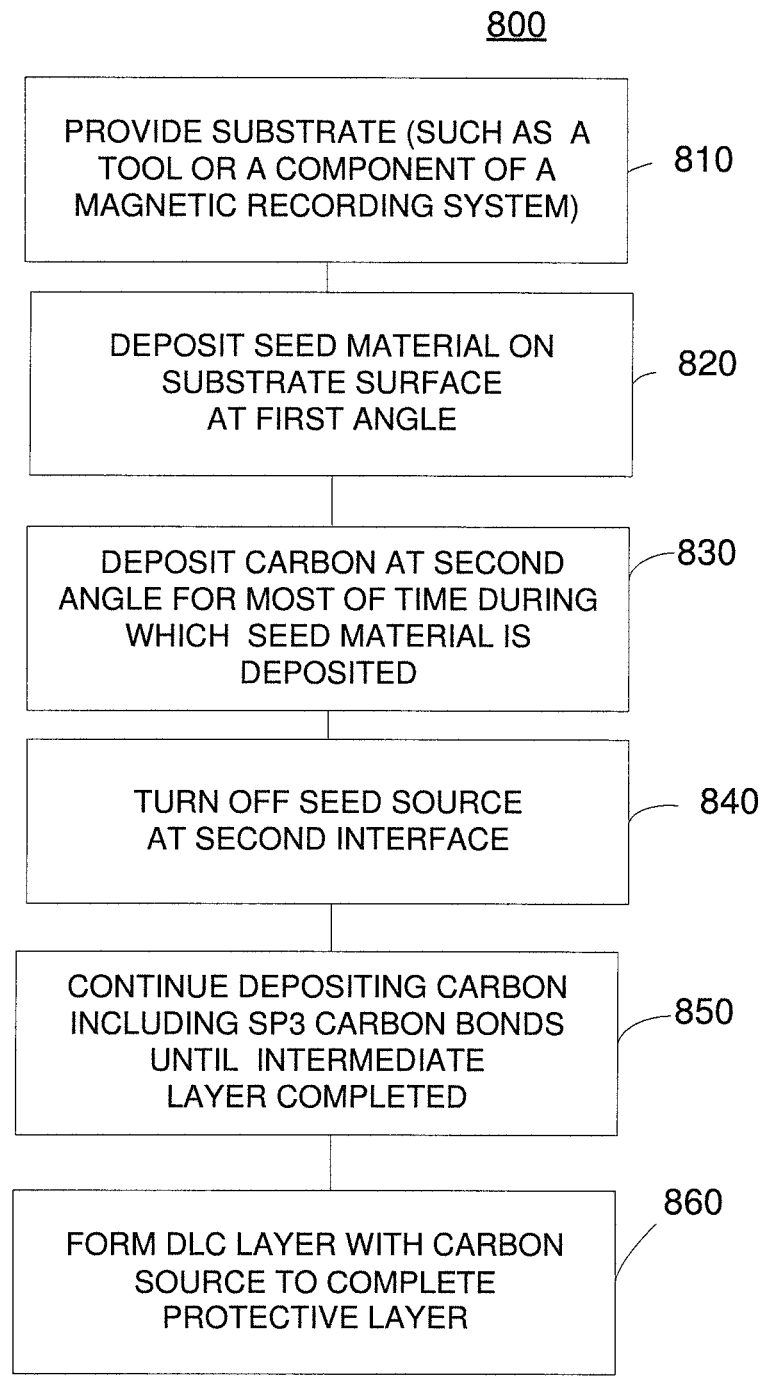
FIG. 8 is a flowchart of a co-deposition process for forming a protective layer in accordance with one embodiment.

One method for forming the protective layer is summarized in FIG. 8. FIG. 8 is a flowchart of a co-deposition process 800 for protecting a substrate such as components of a magnetic recording system (such as a slider or a magnetic medium), a portion of a tool, or a portion of an instrument. In particular embodiments, process 800 can be used in conjunction with the vacuum systems of FIGS. 4 and/or 5 described above. Block 810 of process 800 involves providing a substrate that is one of the aforementioned components (such as a slider (disposed in a row bar), magnetic medium, or a portion of a tool or instrument). Then, in block 820, a seed material is deposited on a surface of the substrate at a first angle. The seed material is initially deposited so that first interface 72 (interface 72) contains about 95-100% seed material.

In some embodiments, a second seed material is simultaneously deposited on the substrate at a third angle. The process then proceeds to block 830, where carbon including sp3 carbon is deposited on the substrate at a second angle not equal to the first angle. A middle portion adjacent to interface 72 is subsequently formed by gradually changing the parameters toward predetermined final values and/or by incrementally changing the parameters for predetermined time intervals. As a result, in certain embodiments, the middle portion may have a composition of about 15-40% silicon, 10-30% nitrogen and 20-70% carbon. In other embodiments, the vacuum system is configured to provide the middle portion with a composition of about 10-40% titanium, 0-40% nitrogen and 20-60% carbon. Depositing the seed material and depositing the carbon material on the top surface of the substrate is performed simultaneously or substantially simultaneously (block 830) to form part of intermediate layer 30. Once the middle portion is formed, the seed material source(s) are shut off in block 840 to allow carbon to be deposited at about 95-100% at the interface 74 in accordance with block 850. After intermediate layer 30 is completed, a DLC layer is formed in block 860 to produce protective layer 45.

In several embodiments, corresponding to the method of FIG. 8, the substrate is rotated at a preselected speed during deposition of the seed material and the carbon material. In a number of embodiments, the process also includes forming magnetic transducers in the substrate, dicing the substrate into row bars, depositing the seed material on an ABS of the row bars at the first angle, while depositing carbon on the substrate at the second angle, and then dicing the substrate into row bars or other components.

Figure 9:
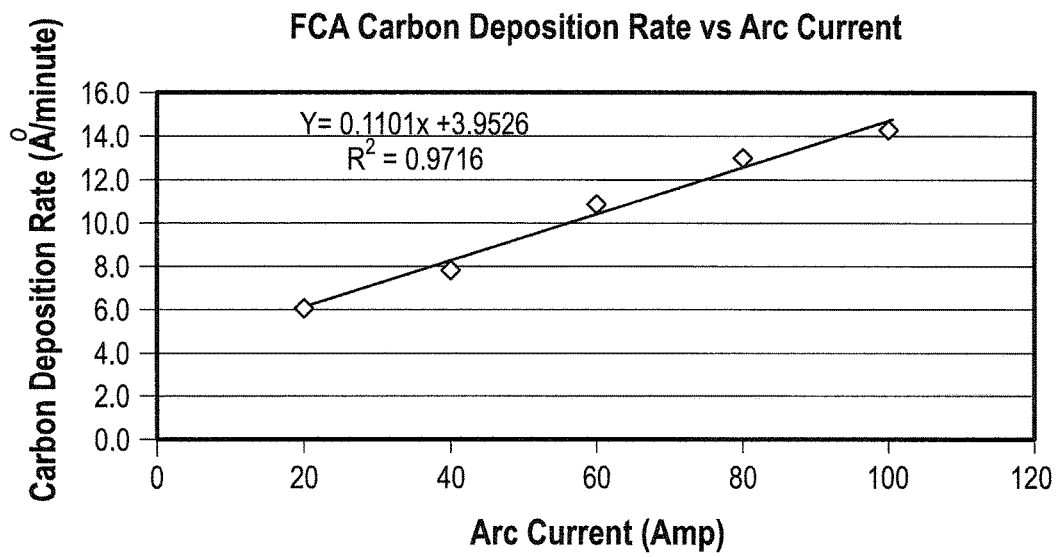
FIG. 9 is a graph of carbon deposition rate versus arc current in accordance with one embodiment.

FIG. 9 is a graph of carbon deposition rate versus arc current in accordance with one embodiment. As can be seen in FIG. 9, when the deposition rate of carbon (FCA-C) is relatively low at 6.0 angstroms/minute, the arc current is relatively low (e.g., about 20 amperes). However, when the deposition rate of carbon (FCA-C) is relatively high at 14.5 angstroms/minute, the arc current is relatively high (e.g., about 100 amperes). Thus, FIG. 9 shows a direct correlation between the carbon deposition rate and the arc current. In addition, FIG. 9 shows that the carbon deposition rate is controlled by the amount of arc current within the vacuum system.

Figure 10:
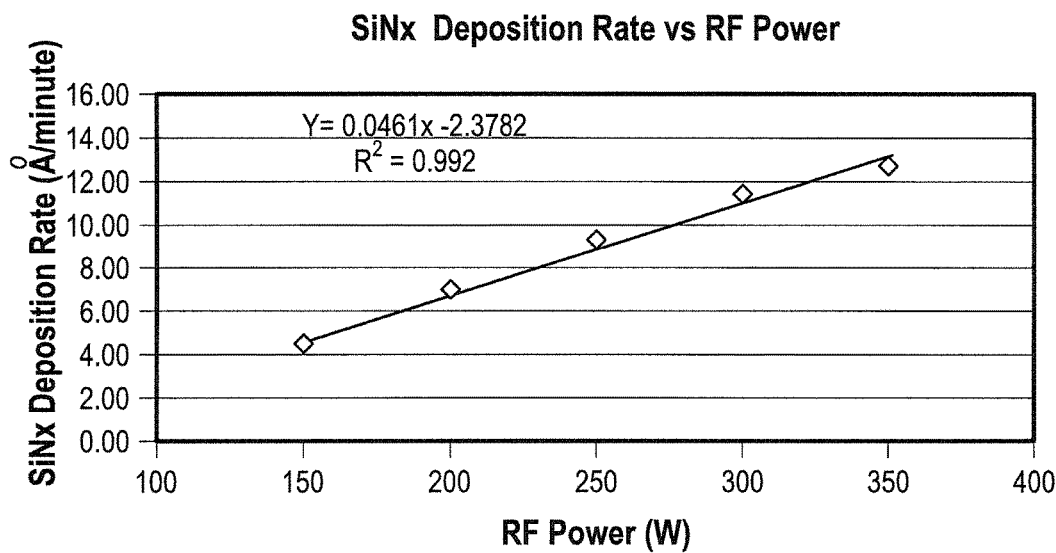
FIG. 10 is a graph of seed material deposition rate versus radio frequency power in accordance with a second embodiment.

FIG. 10 is a graph of SiNx deposition rate versus RF power in accordance with one embodiment. As can be seen in FIG. 10, when the deposition rate of silicon nitride is relatively low at 4.0 angstroms/minute, the RF power is relatively low (e.g., about 150 watts). However, when the deposition rate of silicon nitride is relatively high at about 14.0 angstroms/minute, the RF power is relatively high (e.g., about 350 watts). Thus, FIG. 10 shows a direct correlation between the silicon nitride deposition rate and the RF power value. In addition, FIG. 10 shows that the seed material deposition rate is controlled by the amount of RF power applied during the formation of the intermediate layer 30.

Figure 11:
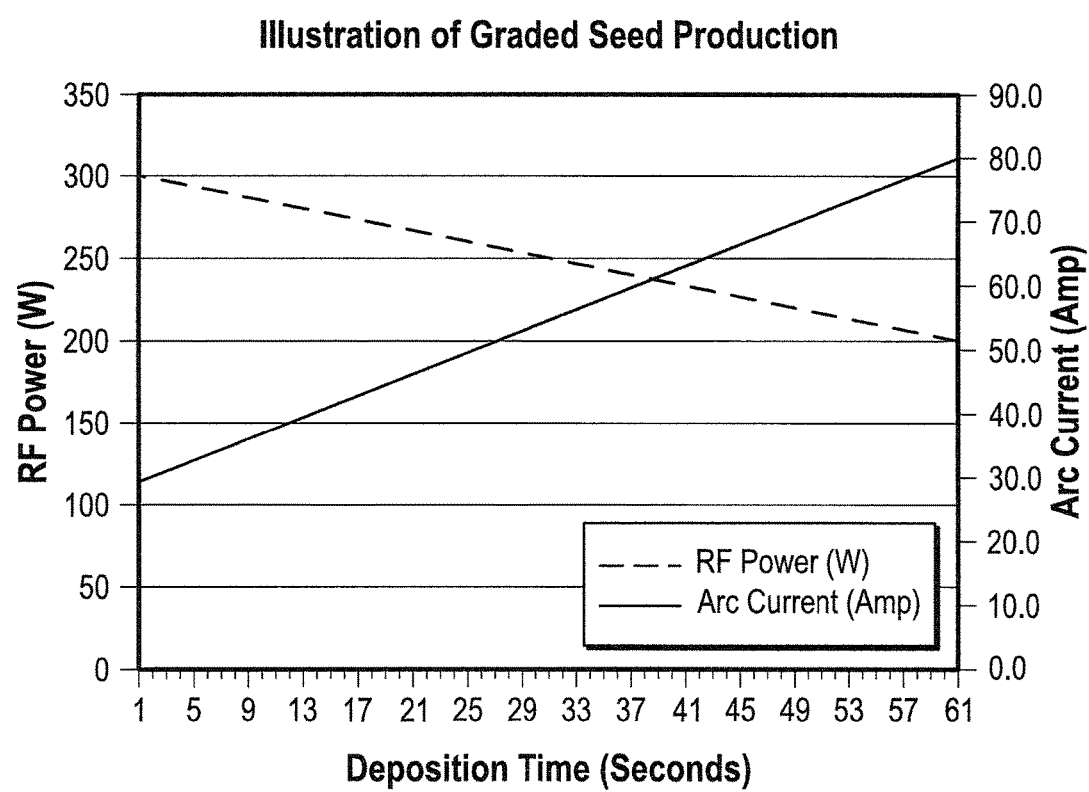
FIG. 11 is a graph of conditions for varying radio frequency power and arc current to produce a graded intermediate layer in accordance with one embodiment.

One example of controlling system parameters to produce the protective layer is illustrated by FIG. 11. FIG. 11 is a graph of suitable power and arc current levels for producing a graded intermediate layer during a specified time interval. FIG. 11 shows that the parameter associated with the seed material starts at high power values, however as the seed material is deposited over time, the power level is gradually decreased. Conversely, the parameter associated with the carbon deposition (arc current) initially is set at a low value. Over time, as the intermediate layer grows, the arc current is increased in value. Specifically, as RF power is ramped down over time, arc current is ramped up to produce a graded intermediate layer. For this particular embodiment, RF Power ramps down from 300 watts to 200 watts, while arc current values are ramped upward from 30 amperes to 80 amperes. Thus, FIG. 11 shows that the parameter for controlling the carbon deposition is inversely proportional to the parameter that controls the seed material deposition.

In order to provide sufficient adhesion between the read-write sensor 35 and intermediate layer 30, a relatively higher initial RF Power and a relatively lower initial arc current can be used to form an interface 72 rich with seed material. Interface 72 contains a relatively higher percentage of seed material than other portions of intermediate layer 30. As the intermediate layer grows thicker, RF power ramps down to a lower final level and arc current ramps up to a higher final level. This variation of the parameters will form a graded intermediate layer 30 as the thickness of the intermediate layer increases. The incorporation of sp3 carbon bonds with seed material can render the new intermediate layer 30 to be denser, harder and more insulative in certain embodiments.

In yet another embodiment, a graded intermediate layer can be formed by independently controlling arc current, coil current and RF power of the vacuum system. In this embodiment, both the arc current and coil current would be initially set at low values, while the RF power would be set at a value between 350 and 300 watts. Thereafter the carbon source parameters would ramp up while the parameter (s) for the seed material would ramp down. The seed material parameter(s) can be turned off once the predetermined time interval or desired thickness for the intermediate layer is reached. In alternative embodiments, a graded composite can be formed by controlling arc current, coil current, RF power and chamber pressure.

Whether the vacuum system employs two or three sources (collectively multiple sources), the multiple deposition sources can be independently controlled to enable interface 74 of intermediate layer 30 to be as close as possible to being entirely carbon and interface 72 to be as close as possible to being entirely seed material. Specifically, near the end of forming intermediate layer 30, in several embodiments, the seed source(s) are turned off to form interface 74. Thereafter, the carbon source remains on to form the DLC portion of protective layer 45.

Initial and final levels of arc current and RF power can easily be determined through experimentation to produce the optimal protective layer in accordance with end-use requirements of the tool or apparatus to be protected. This example is applicable to seed materials such as Ti, TiN, Si, Si3N4, SiNx and TixSi3N4 (where x is a nonzero integer).

The above detailed description is provided to enable any person skilled in the art to practice the various embodiments described herein. While several embodiments have been particularly described with reference to the various figures, it should be understood that these are for illustration purposes only.

Various modifications to these embodiments will be readily apparent to those skilled in the art, and generic principles defined herein may be applied to other embodiments. For example, although the protective layer has been described as a bilayer, in other embodiments, the protective layer may be composed of more than two layers. For example, there could be a thin intervening layer between either the first or second interface in the case when the intermediate layer is utilized for protecting a tool or an instrument. Diamond-like carbon (DLC) is a suitable carbon layer for this embodiment. Thus, many changes and modifications may be made to the embodiments described herein, by one having ordinary skill in the art, without departing from the spirit and scope of the claims set forth below.

What is claimed is:

1. An apparatus comprising:
   a metal substrate;
   a diamond-like carbon (DLC) layer above the metal substrate; and
   an intermediate layer having a first interface at the metal substrate and a second interface at the DLC layer, wherein the intermediate layer comprises a carbon mixture that includes sp3 carbon bonds and a seed material and wherein the percentage of the sp3 carbon bonds and the percentage of the seed material within the carbon mixture varies with respect to the thickness of the intermediate layer,
   wherein the seed material comprises a material selected from the group consisting of Ti, TiN, Si3N4, SiNx, TixSi3N4, and combinations thereof, where x is a non-zero positive integer, and
   wherein an atomic percent of the sp3 carbon bonds is greater than an atomic percent of the seed material.

2. The apparatus of claim 1 wherein the thickness of the intermediate layer ranges from about three to about nine angstroms.

3. The apparatus of claim 1 wherein the thickness of the DLC layer and the intermediate layer ranges from about fifteen to about twenty five angstroms.

4. The apparatus of claim 1 wherein the composition of the intermediate layer at the first interface is between 95 atomic percent and 100 atomic percent seed material.

5. The apparatus of claim 1 wherein the composition of the intermediate layer at the second interface is between 95 atomic percent and 100 atomic percent carbon.

6. The apparatus of claim 1 wherein the intermediate layer has a middle portion between the first interface and the second interface, the middle portion having a composition of about 15-40 atomic percent silicon, 10-30 atomic percent nitrogen and 20-70 atomic percent carbon.

7. The apparatus of claim 1 wherein the intermediate layer has a middle portion between the first and the second interface, the middle portion having a composition of about 10-40 atomic percent titanium, 0-40 atomic percent nitrogen and 20-60 atomic percent carbon.

8. The apparatus of claim 1 wherein the apparatus is a magnetic read/write head.

9. The apparatus of claim 1 wherein the apparatus is a tool.

10. The apparatus of claim 1, wherein the seed material comprises SiN.

11. An apparatus comprising:
    a metal substrate;
    a diamond-like carbon (DLC) layer above the metal substrate; and
    an intermediate layer having a first interface at the metal substrate and a second interface at the DLC layer, wherein the intermediate layer comprises a carbon mixture that includes a seed material and wherein the percentage of carbon and the percentage of the seed material within the carbon mixture varies with respect to the thickness of the intermediate layer,
    wherein the seed material comprises a material selected from the group consisting of Ti, TiN, Si3N4, SiNx, TixSi3N4, and combinations thereof, where x is a non-zero positive integer,
    wherein the composition of the intermediate layer at the first interface is between 95 atomic percent and 100 atomic percent seed material, and
    wherein the composition of the intermediate layer at the second interface is between 95 atomic percent and 100 atomic percent sp3 carbon bonds.

12. The apparatus of claim 11 wherein the apparatus is a magnetic read/write head.

13. The apparatus of claim 11, wherein the seed material comprises SiN.

* * * * *